United States Patent
Han et al.

(10) Patent No.: US 11,766,866 B2
(45) Date of Patent: Sep. 26, 2023

(54) INKJET PRINTING APPARATUS

(71) Applicant: Samsung Display Co., LTD., Yongin-si (KR)

(72) Inventors: Jeong Won Han, Seongnam-si (KR); Myung Soo Huh, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 78 days.

(21) Appl. No.: 17/557,673

(22) Filed: Dec. 21, 2021

(65) Prior Publication Data

US 2022/0258465 A1    Aug. 18, 2022

(30) Foreign Application Priority Data

Feb. 18, 2021    (KR) .................. 10-2021-0021956

(51) Int. Cl.
*B41J 2/14* (2006.01)
*B41J 2/145* (2006.01)

(52) U.S. Cl.
CPC ............. *B41J 2/1433* (2013.01); *B41J 2/145* (2013.01); *B41J 2002/14475* (2013.01)

(58) Field of Classification Search
CPC ................................. B41J 2/1433; B41J 2/145
See application file for complete search history.

(56) References Cited

U.S. PATENT DOCUMENTS

2004/0263564 A1* 12/2004 Maekawa ............... B41J 2/2125
  347/40
2006/0050107 A1*  3/2006 Yamanaka ............ B41J 2/1433
  347/47
2007/0285463 A1* 12/2007 Kanda ................... B41J 2/2125
  347/40

FOREIGN PATENT DOCUMENTS

| JP | 2007-118582 | 5/2007 |
| JP | 4582844 | 11/2010 |
| JP | 4816944 | 11/2011 |
| KR | 10-0532866 | 12/2005 |

OTHER PUBLICATIONS

Brian Derby, "Additive Manufacture of Ceramics Components by Inkjet Printing", Engineering, Mar. 2015, pp. 113-123, vol. 1, Issue 1.

* cited by examiner

*Primary Examiner* — Jason S Uhlenhake

(74) *Attorney, Agent, or Firm* — KILE PARK REED & HOUTTEMAN PLLC

(57) ABSTRACT

An inkjet printing apparatus includes a print head including an inkjet head having a nozzle surface; nozzles disposed on the nozzle surface, that spray an ink from the nozzles; and a heater that heats a temperature of the inkjet head to a reference temperature. The nozzles include a first nozzle having a first diameter; and a second nozzle having a second diameter different from the first diameter of the first nozzle, the nozzle surface includes a first area in which the first nozzle is disposed and a second area in which the second nozzle is disposed, the first area has a first temperature in case that the heater heats the inkjet head to the reference temperature, and the second area has a second temperature different from the first temperature in case that the heater heats the inkjet head to the reference temperature.

20 Claims, 10 Drawing Sheets

30: 30A, 30B, 30C

INKJET PRINTING APPARATUS

CROSS-REFERENCE TO RELATED APPLICATION(S)

This application claims priority to and benefits of Korean Patent Application No. 10-2021-0021956 under 35 U.S.C. § 119 filed on Feb. 18, 2021 in the Korean Intellectual Property Office, the entire contents of which are incorporated herein by reference.

BACKGROUND

1. Technical Field

The disclosure relates to an inkjet printing apparatus.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and may include a display panel, such as an organic light emitting display panel or a liquid crystal display panel. The light emitting display panel may include light emitting elements, for example, light emitting diodes (LED), and examples of the light emitting diode may include an organic light emitting diode (OLED) using an organic material as a light emitting material and an inorganic light emitting diode using an inorganic material as a light emitting material.

On the other hand, an inkjet printing apparatus may be used to form an organic layer included in a display device or to form an inorganic light emitting diode. After an ink or solution is inkjet-printed, a post-treatment process may be executed to transfer the inorganic light emitting diode element or to form the organic material layer. The inkjet printing apparatus may execute a process of supplying an ink or solution to an inkjet head and spraying the ink or the solution onto a substrate to be processed (for example, a target substrate) using the inkjet head.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide an inkjet printing apparatus in which uniformity of an ink sprayed through a nozzle of an inkjet head is improved.

However, aspects of the disclosure are not restricted to the ones set forth herein. The above and other aspects of the disclosure will become more apparent to one of ordinary skill in the art to which the disclosure pertains by referencing the detailed description of the disclosure given below.

According to an embodiment, an inkjet printing apparatus may include a print head including an inkjet head having a nozzle surface; nozzles disposed on the nozzle surface that spray an ink from the nozzles; and a heater that heats a temperature of the inkjet head to a reference temperature, wherein the nozzles include a first nozzle having a first diameter; and a second nozzle having a second diameter different from the first diameter of the first nozzle, the nozzle surface may include a first area in which the first nozzle is disposed and a second area in which the second nozzle is disposed, the first area has a first temperature in case that the heater heats the inkjet head to the reference temperature, and the second area has a second temperature different from the first temperature in case that the heater heats the inkjet head to the reference temperature.

The first nozzle and the second nozzle may be disposed on a same extension line extending in a first direction.

The nozzles may include a third nozzle having a third diameter different from the first diameter of the first nozzle and the second diameter of the second nozzle.

The nozzle surface may include a third area including the third nozzle, and the third area may have a third temperature different from the first temperature of the first area and the second temperature of the second area in case that the heater heats the inkjet head to the reference temperature.

The first nozzle, the second nozzle, and the third nozzle are disposed on a same extension line extending in a first direction.

The first nozzle and the third nozzle may be disposed on a same extension line extending in a second direction intersecting the first direction.

The first temperature of the first area may be higher than the second temperature of the second area, and the first diameter of the first nozzle may be smaller than the second diameter of the second nozzle.

The first diameter of the first nozzle and the second diameter of the second nozzle may satisfy:

$$D1 = \frac{b1^2}{a1c1Oh^2}, D2 = \frac{b2^2}{a2c2Oh^2}$$

where $D1$ is the first diameter of the first nozzle, $D2$ is the second diameter of the second nozzle, $a1$ is a density of the ink at the first temperature of the first area, $a2$ is a density of the ink at the second temperature of the second area, $b1$ is a viscosity of the ink at the first temperature of the first area, $b2$ is a viscosity of the ink at the second temperature of the second area, $c1$ is a surface tension of the ink at the first temperature of the first area, $c2$ is a surface tension of the ink at the second temperature of the second area, and $Oh$ is an Ohnesorge number.

According to an embodiment, an inkjet printing apparatus may include a print head including an inkjet head having a nozzle surface; nozzles disposed on the nozzle surface, that sprays an ink from the nozzles; and a heater that heats a temperature of the inkjet head to a reference temperature, wherein the nozzle surface may include areas having different temperatures in case that the heater heats the inkjet head to the reference temperature, and a diameter of a nozzle in each of the areas satisfies the following equation:

$$Dn = \frac{bn^2}{ancnOh^2}$$

where $Dn$ is a diameter of an $n^{th}$ nozzle disposed in an $n^{th}$ area where a temperature of the nozzle surface is an $n^{th}$ temperature, n being a natural number, $an$ is a density of the ink at the $n^{th}$ temperature, $bn$ is a viscosity of the ink at the $n^{th}$ temperature, $cn$ is a surface tension of the ink at the $n^{th}$ temperature, and Oh is an Ohnesorge number. The nozzle surface may include a first area having a first temperature and a second area having a second temperature different from the first temperature of the first area in case that the heater heats the inkjet head to the reference temperature, and the nozzles may include a first nozzle unit including at least one first nozzle disposed in the first area; and a second nozzle unit including at least one second nozzle in the second area.

A first diameter of the at least one first nozzle may be different from a second diameter of the at least one second nozzle.

The first nozzle unit may include first nozzles, and the first nozzles may be spaced apart from each other in a first direction in the first area of the nozzle surface.

The at least one first nozzle and the at least one second nozzle may be disposed on a same extension line extending in the first direction.

The first nozzles may have a same diameter.

The first temperature of the first area of the nozzle surface may be higher than the second temperature of the second area of the nozzle surface, and the first diameter of the at least one first nozzle may be smaller than the second diameter of the at least one second nozzle.

The at least one first nozzle may be disposed at a center of the nozzle surface, and the at least one second nozzle may be disposed at an edge of the nozzle surface.

The nozzle surface may include a third area having a third temperature in case that the heater heats the inkjet head to the reference temperature, the nozzles may include a third nozzle unit including at least one third nozzle in the third area, and the third temperature of the third area of the nozzle surface may be different from the first temperature of the first area of the nozzle surface and the second temperature of the second area of the nozzle surface.

The at least one first nozzle, the at least one second nozzle, and the at least one third nozzle may be disposed on a same extension line extending in a first direction.

The at least one first nozzle and the at least one second nozzle may be disposed on a same extension line extending in a first direction, and the at least one first nozzle and the at least one third nozzle may be disposed on a same extension line extending in a second direction intersecting the first direction.

A first diameter of the at least one first nozzle, a second diameter of the at least one second nozzle, and a third diameter of the at least one third nozzle may be different from each other.

An inkjet printing apparatus according to an embodiment may include a print head unit including an inkjet head for spraying an ink through nozzles formed on a nozzle surface and a heater for heating the inkjet head to a reference temperature. In the case of heating the inkjet head to the reference temperature using the heater, the nozzle surface of the inkjet head may include areas having different temperatures, and the nozzles formed in the areas having different temperatures may have different diameters. By designing the diameters of the nozzles to be different depending on the temperature of the nozzle surface, the ejection characteristics of the ink sprayed through the nozzle become the same, which makes it possible to improve reliability of a printing process using the inkjet printing apparatus.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
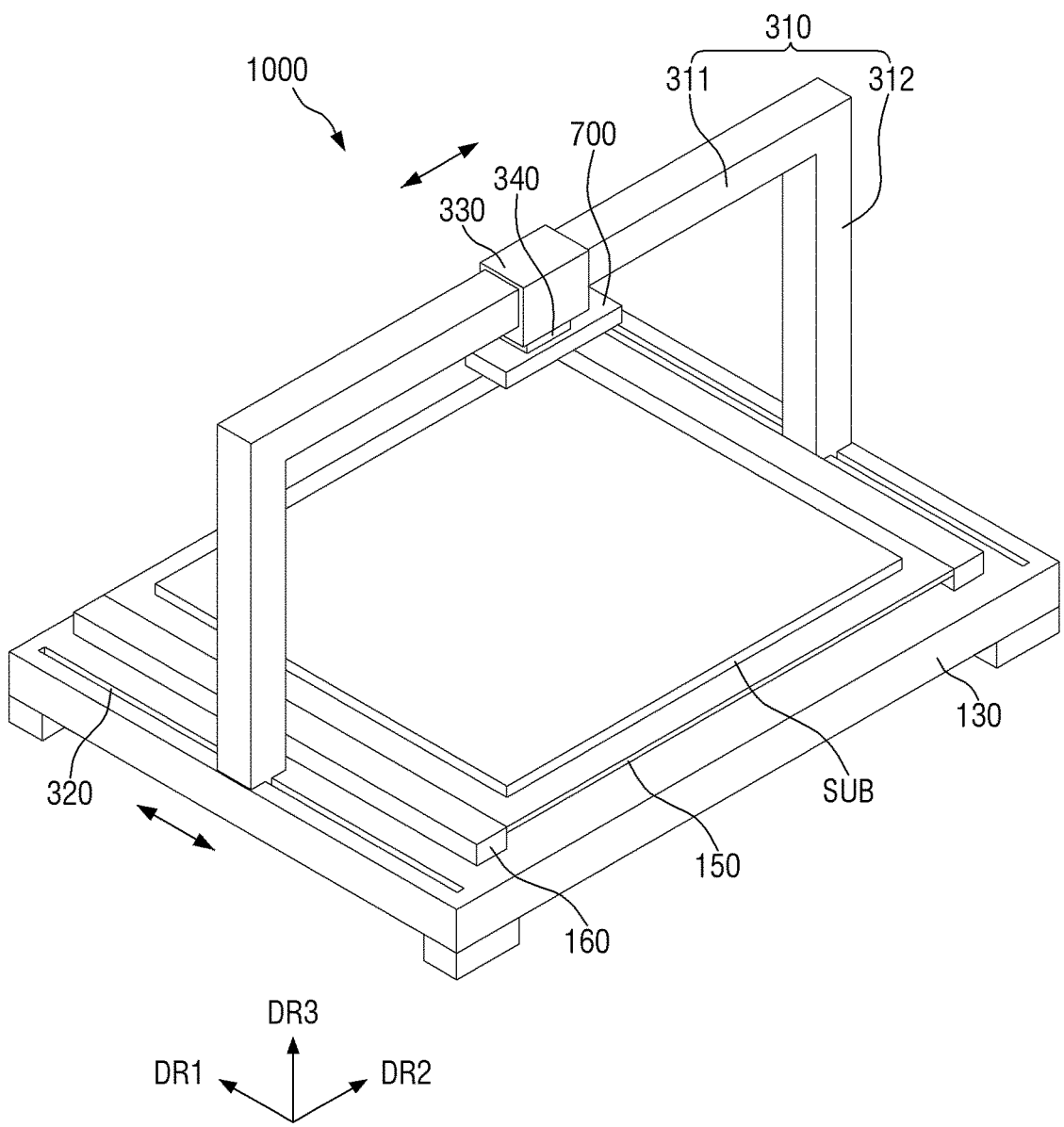
FIG. 1 is a schematic perspective view of an inkjet printing apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic perspective view of an inkjet printing apparatus according to an embodiment.

Referring to FIG. 1, an inkjet printing apparatus 1000 according to an embodiment may include a base frame 130, a stage 150, a stage moving unit or stage mover 160, a print head moving unit or print head mover 320, 330, and 340, and a print head unit or print head 700.

Hereinafter, a first direction DR1, a second direction DR2, a third direction DR3 are as illustrated in the drawing illustrating the inkjet printing apparatus 1000. The first direction DR1 and the second direction DR2 are located or disposed on one plane or on a plane and are orthogonal to each other, and the third direction DR3 is a direction perpendicular to the first direction DR1 and the second direction DR2.

The stage 150 may be disposed on the base frame 130. The stage 150 provides a space for placing a target substrate SUB. For example, the target substrate SUB to be subjected to the printing process may be mounted on the top surface of the stage 150. A substrate aligner (not shown) may be installed above the stage 150 to align the target substrate SUB. The substrate aligner may be made of quartz or a ceramic material, and may be provided in the form of an electrostatic chuck, but is not limited thereto.

The stage 150 may be made of a transparent or translucent material capable of transmitting light, or an opaque material capable of reflecting light. The overall substantially planar shape of the stage 150 may follow the substantially planar shape of the target substrate SUB. For example, in case that the target substrate SUB has a substantially rectangular shape, the overall shape of the stage 150 may be substantially rectangular, and in case that the target substrate SUB has a substantially circular shape, the overall shape of the stage 150 may be substantially circular. In the drawing, there is illustrated the stage 150 having a substantially rectangular shape in which long sides are disposed in the second direction DR2 and short sides are disposed in the first direction DR1.

The stage 150 may be fixed to the stage moving unit 160 and may move together along the movement of the stage moving unit 160. The stage moving unit 160 may be installed on the base frame 130 and may move on the base frame 130 along the first direction DR1. In case that the stage moving unit 160 is provided, a second horizontal moving unit or second horizontal mover 320 for moving the print head unit 700 in the first direction DR1 may be omitted.

The print head unit 700 may be disposed above the stage 150 (in the third direction DR3). The print head unit 700 serves to print ink on the target substrate SUB. The inkjet printing apparatus 1000 may further include an ink supply unit or ink supplier such as an ink cartridge, and the ink supplied from the ink supply unit may be sprayed (ejected) toward the target substrate SUB through the print head unit 700.

An ink 30 (see FIG. 2) may be provided in a solution state. In an embodiment, the ink 30 may include, for example, a solvent and an organic material contained in the solvent. The organic material may be dispersed in the solvent. The organic material may be a solid material that ultimately remains on the target substrate SUB after the solvent is removed. The solvent may be a material that is vaporized or volatilized at room temperature or by heat. The solvent may be acetone, water, alcohol, toluene, or the like within the spirit and the scope of the disclosure. In an embodiment, the ink 30 may contain, for example, a solvent and dipoles in the solvent. The dipoles may be dispersed in the solvent. The dipole may be a solid material that ultimately remains on the target substrate SUB after the solvent is removed.

The print head unit 700 may be mounted on a support unit or support 310 and spaced apart from the stage 150 by a distance. The support unit 310 may include a horizontal support part 311 extending in a horizontal direction and vertical support parts 312 connected to the horizontal support part 311 and extending in the third direction DR3 which is a vertical direction. The extension direction of the horizontal support part 311 may be the same as the second direction DR2 which is the long side direction of the stage 150. Ends of the vertical support parts 312 may be placed on the base frame 130.

The distance between the print head unit 700 and the stage 150 may be adjusted by the height of the support unit 310. In case that the target substrate SUB is placed on the stage 150, the distance between the print head unit 700 and the stage 150 may be adjusted within a range in which a process space can be secured by allowing the print head unit 700 to have a certain or given distance from the target substrate SUB.

Although one print head unit 700 is illustrated in the drawing, the disclosure is not limited thereto. For example, in the case of a process of providing different kinds of inks to the target substrate SUB, the same number of print head units 700 as the kinds of the inks may be provided.

The print head unit 700 may be moved in the horizontal or vertical direction by the print head moving unit. The print head moving unit may include a first horizontal moving unit or a first horizontal mover 330, a second horizontal moving unit or a second horizontal mover 320, and a vertical moving unit or a vertical mover 340.

The first horizontal moving unit 330 may be installed on the horizontal support part 311, and the second horizontal moving unit 320 may be installed on the base frame 130.

The first horizontal moving unit 330 may move the print head unit 700 on the horizontal support part 311 in the second direction DR2. The second horizontal moving unit 320 may move the vertical support parts 312 in the first direction DR1 to move the print head unit 700 mounted on the support unit 310 in the first direction DR1.

Through the horizontal movement by the first horizontal moving unit 330 and the second horizontal moving unit 320, the ink 30 may be sprayed to the entire area of the target substrate SUB even using the print head unit 700 having an area smaller than that of the target substrate SUB to perform the printing process.

The vertical moving unit 340 may adjust the distance between the print head unit 700 and the stage 150 by lifting or lowering the print head unit 700 on the horizontal support part 311 in the vertical direction. For example, in case that the target substrate SUB is placed on the stage 150, the position of the print head unit 700 may be adjusted within a range in which a process space can be secured by allowing the print head unit 700 to have a certain or given distance from the target substrate SUB by the vertical moving unit 340.

On the other hand, although it is illustrated in the drawing that the stage 150 is moved along the first direction DR1 by the stage moving unit 160 on the base frame 130 and the print head unit 700 is moved along the first direction DR1 and the second direction DR2 by the second horizontal moving unit 320 and the first horizontal moving unit 330, respectively, on the base frame 130, the disclosure is not limited thereto. For example, in an embodiment, the inkjet printing apparatus 1000 may not include the second horizontal moving unit 320 for moving the print head unit 700 along the first direction DR1. The support unit 310 may be fixed, and the print head unit 700 may reciprocate along the second direction DR2 on the stage 150 by the first horizontal moving unit 330 and the stage 150 may reciprocate along the first direction DR1 by the stage moving unit 160 to perform the printing process on the entire area of the target substrate SUB. In an embodiment, the inkjet printing apparatus 1000 may not include the stage moving unit 160 for moving the stage 150 along the first direction DR1. The stage 150 may be fixed, the print head unit 700 may reciprocate along the second direction DR2 on the stage 150 by the first horizontal moving unit 330 and the print head unit 700 may reciprocate along the first direction DR1 on the stage 150 by the second horizontal moving unit 320 to perform the printing process on the entire area of the target substrate SUB. For example, the relative position between the stage 150 and the print head unit 700 may be adjusted in a state where the stage 150 is fixed and the print head unit 700 moves along the first direction DR1 and the second direction DR2 that are the horizontal directions, or may be adjusted in a state where the print head unit 700 is fixed and the stage 150 moves along the first direction DR1 and the second direction DR2 that are the horizontal directions.

Hereinafter, although the case where the stage 150 reciprocates along the first direction DR1 using the stage moving unit 160 and the print head unit 700 reciprocates along the second direction DR2 and the first direction DR1 by the first horizontal moving unit 330 and the second horizontal moving unit 320 will be described as an example in the drawing, the method of adjusting the relative position of the stage 150 and the print head unit 700 is not limited to thereto.

Figure 2:
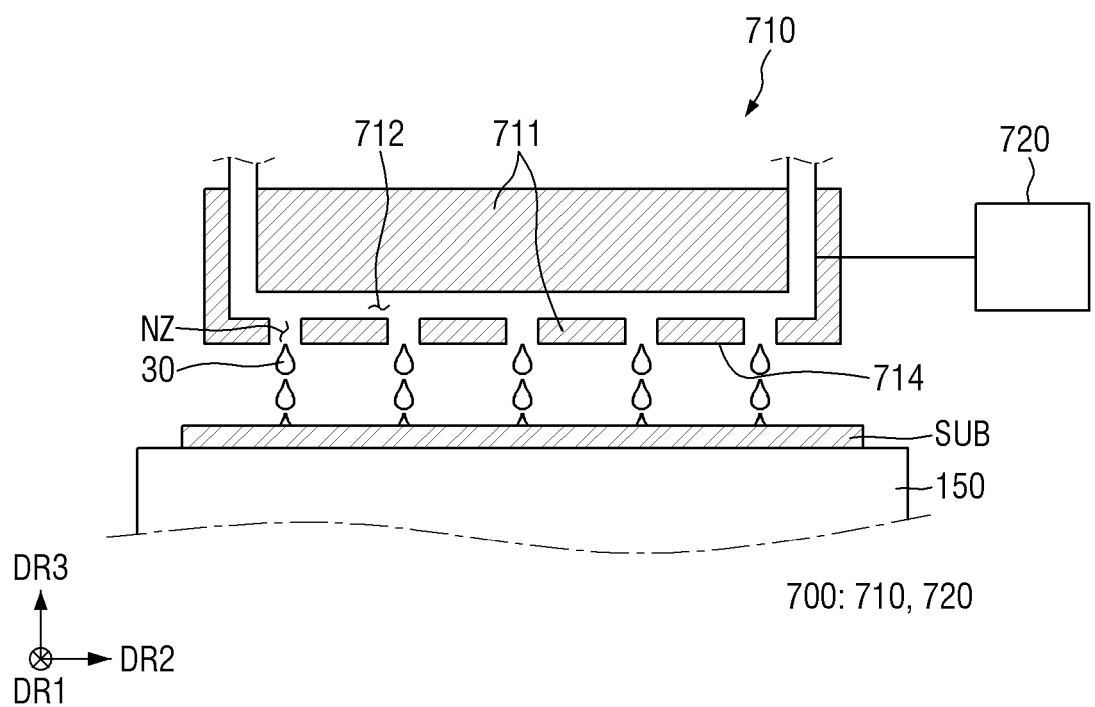
FIG. 2 is a partial schematic cross-sectional view of an inkjet printing apparatus according to an embodiment.
Figure 3:
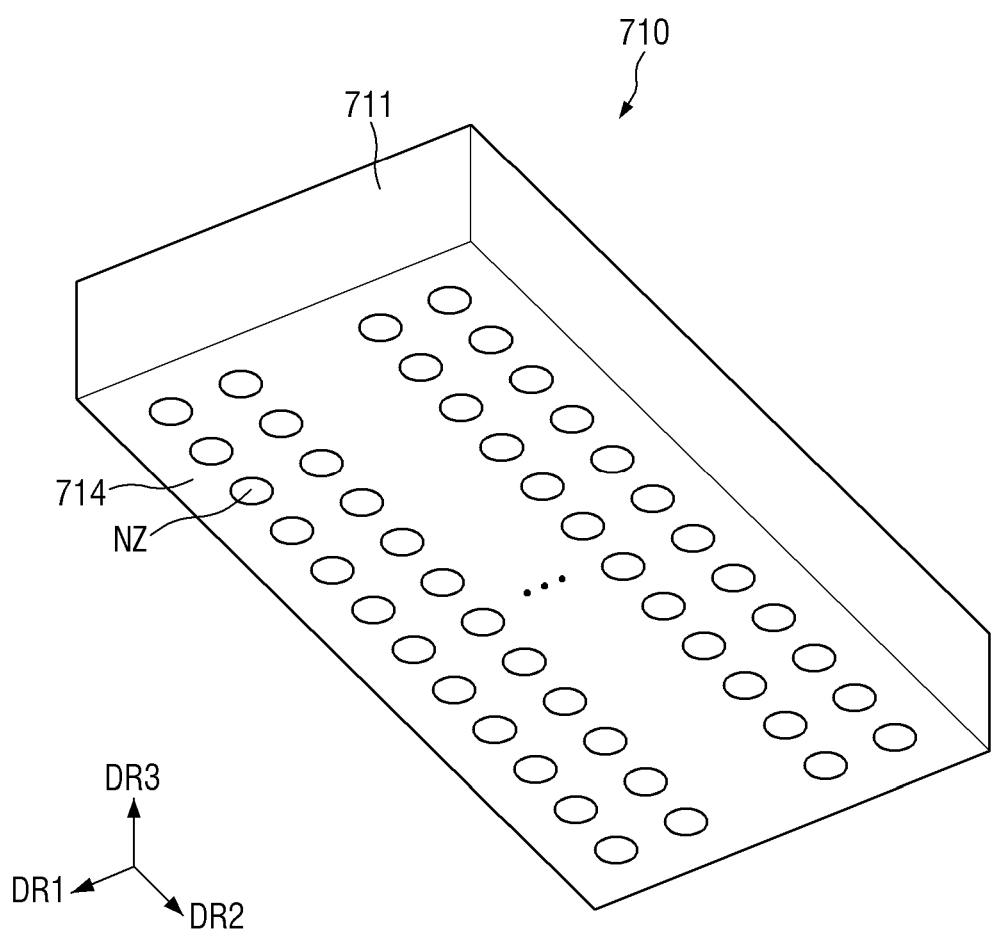
FIG. 3 is a schematic perspective view of an inkjet head according to an embodiment.

FIG. 2 is a partial schematic cross-sectional view of an inkjet printing apparatus according to an embodiment. FIG. 3 is a schematic perspective view of an inkjet head according to an embodiment.

Referring to FIGS. 1 to 3, the print head unit 700 according to an embodiment may include an inkjet head 710 and a heater 720.

The inkjet head 710 may have a shape extending along one direction or extending along a direction. The extension direction of the inkjet head 710 may be the same as the extension direction of the horizontal support part 311 of the support unit 310. For example, the extension direction of the inkjet head 710 may be the second direction DR2 which is the long side direction of the stage 150.

The inkjet head 710 may include a base portion 711, an inner tube 712, and a nozzle surface 714 where nozzles NZ are formed. The inkjet head 710 may further include an ejection unit.

The inkjet head 710 may include the nozzles NZ to eject the ink 30 through each of the nozzles NZ. The ink 30 ejected from the nozzles NZ may be sprayed onto the target substrate SUB disposed on the stage 150. The nozzles NZ may be formed on a bottom surface (nozzle surface) 714 of the inkjet head 710 and may be arranged or disposed along one direction or along a direction in which the inkjet head 710 extends.

The base portion 711 may form the main body of the inkjet head 710. The base portion 711 may have a shape extending along one direction or extending along a direction. The base portion 711 may have a shape extending along the second direction DR2, similarly to the shape of the inkjet head 710. However, the disclosure is not limited thereto, and the base portion 711 may have a substantially circular or a substantially polygonal shape.

The inner tube 712 may be disposed inside of the base portion 711. The inner tube 712 may be formed along the extension direction of the inkjet head 710. The ink 30 may be supplied to the inner tube 712, and the supplied ink 30 may be supplied to the nozzles NZ while flowing along the inner tube 712.

The nozzles NZ may be formed on one surface or a surface of the base portion 711, for example, the bottom surface (nozzle surface) 714 of the base portion 711. Hereinafter, in this specification, the bottom surface 714 of the base portion 711 where the nozzles NZ are formed may be referred to as the nozzle surface 714. For example, the nozzle surface 714 where the nozzles NZ are formed may form the bottom surface of the inkjet head 710. The nozzles NZ may be formed in a hole shape penetrating the nozzle surface 714.

The nozzle surface 714 may face the stage 150 disposed under or below the inkjet head 710. The nozzle surface 714 may extend in one direction or extend in a direction in a plan view. For example, the extension direction of the nozzle surface 714 may be the same as or substantially the same as the extension direction of the horizontal support part 311 of the support unit 310. For example, the extension direction of the nozzle surface 714 may be the second direction DR2 which is the long side direction of the stage 150.

The nozzles NZ may be formed on the nozzle surface 714. The nozzles NZ may provide a path through which the ink 30 is sprayed. The nozzles NZ may be connected to the inner tube 712 of the inkjet head 710 through the nozzle surface 714. The ink 30 supplied from the inner tube 712 of the inkjet head 710 may be sprayed through the nozzles NZ. The ink 30 sprayed through each of the nozzles NZ may be supplied to the top surface of the target substrate SUB. The nozzles NZ may be arranged or disposed in one column or multiple columns. The spray amount of the ink 30 through each of the nozzles NZ may be adjusted depending on the voltage applied to each nozzle NZ.

The heater 720 may serve to adjust the temperature of the ink 30 provided to the inkjet head 710. The heater 720 may serve to heat the inkjet head 710 such that the temperature of the ink 30 sprayed from the inkjet head 710 becomes a reference temperature. The reference temperature may be defined as an optimal temperature at which the ink 30 is sprayed onto the target substrate SUB. Further, the reference temperature may be set to the temperature of the nozzle surface 714 of the inkjet head 710.

As described above, the heater 720 may heat the base portion 711 of the inkjet head 710 such that the temperature of the nozzle surface 714 becomes the reference temperature. The heater 720 may heat the base portion 711 of the inkjet head 710 to indirectly heat the ink 30 flowing through the inner tube 712 formed inside of the base portion 711. On the other hand, in this specification, although it is illustrated that the heater 720 is separated from the inkjet head 710, the position of the heater 720 is not limited thereto. For example, the heater 720 may be adhered to or directly adhered to the inkjet head 710 to adjust the temperature of the base portion 711, or may be separated from the inkjet head 710 to adjust the temperature of the base portion 711 through another member.

Figure 4:
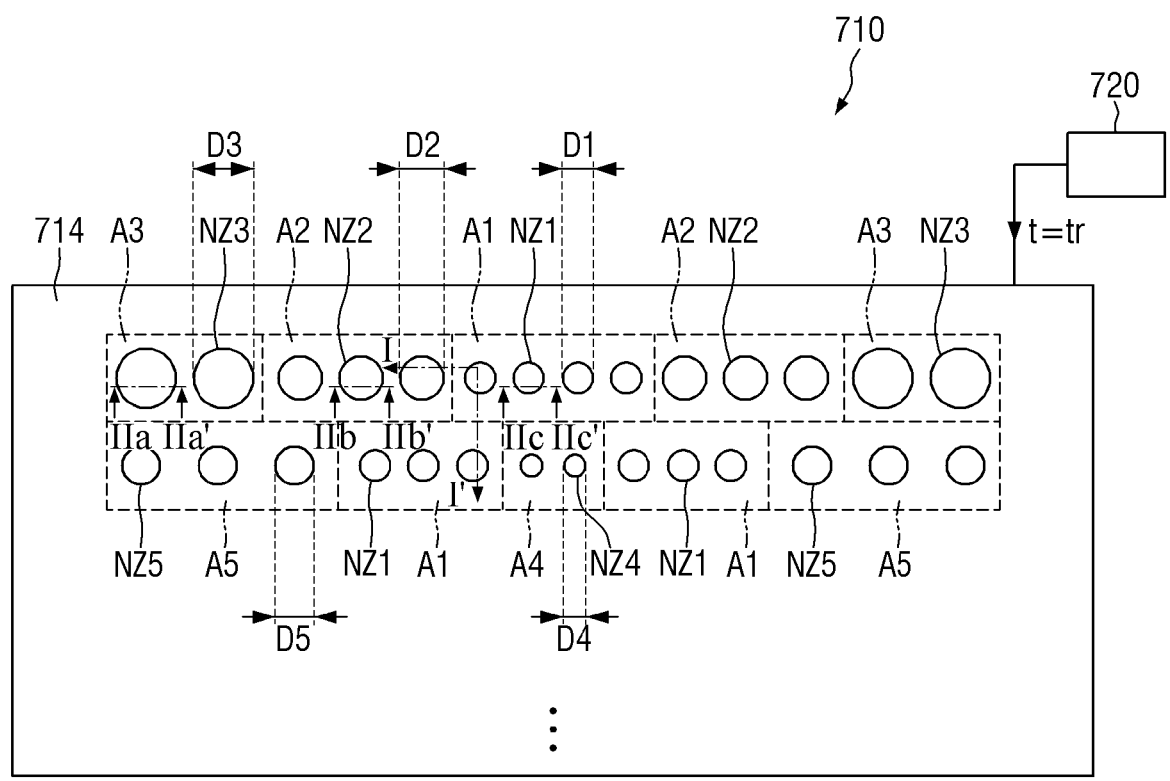
FIG. 4 is a bottom view of a print head unit according to an embodiment.
Figure 5:
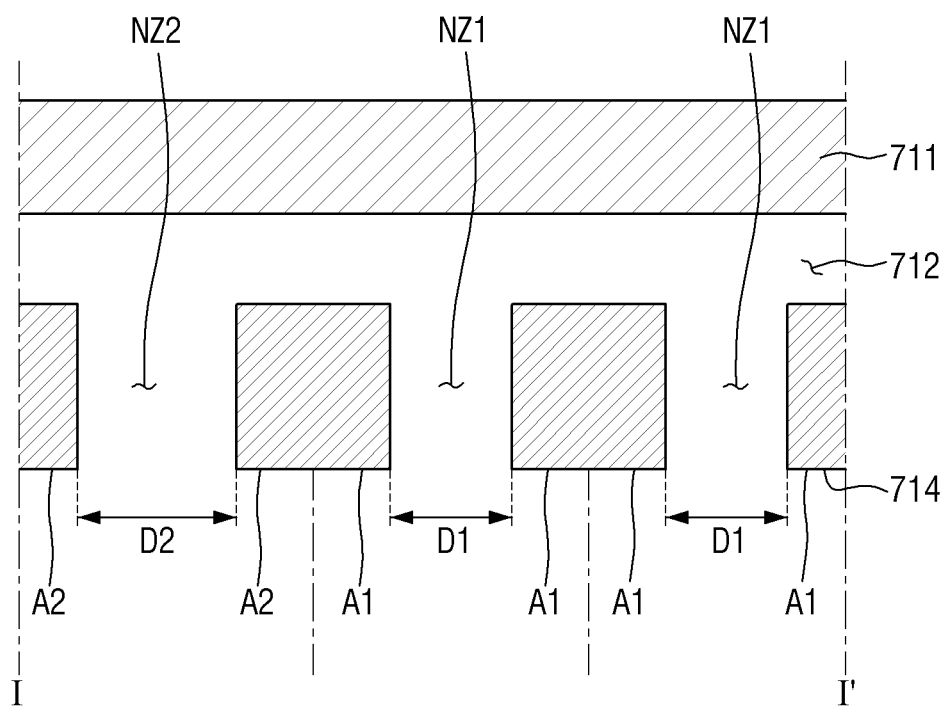
FIG. 5 is a schematic cross-sectional view taken along line I-I' of FIG. 4.

FIG. 4 is a bottom view of a print head unit according to an embodiment. FIG. 5 is a schematic cross-sectional view taken along line I-I' of FIG. 4.

Referring to FIGS. 4 and 5, although the inkjet head 710 is heated using the heater 720 such that that the temperature of the nozzle surface 714 of the inkjet head 710 becomes a reference temperature tr, the temperature of the nozzle surface 714 of the inkjet head 710 may be different depending on positions or areas. In the case of heating the inkjet head 710 to the reference temperature tr using the heater 720, the nozzle surface 714 of the inkjet head 710 may include areas having different temperatures. For example, in the case of heating the inkjet head 710 to the reference temperature tr using the heater 720, the nozzle surface 714 may include a first area A1 where the temperature of the nozzle surface 714 is a first temperature t1, a second area A2 where the temperature of the nozzle surface 714 is a second temperature t2, a third area A3 where the temperature of the nozzle surface 714 is a third temperature t3, and a fourth area A4 where the temperature of the nozzle surface 714 is a fourth temperature t4, and a fifth area A4 where the temperature of the nozzle surface 714 is a fifth temperature t5. The first to fifth temperatures t1, t2, t3, t4, and t5 may be different from each other.

The nozzles NZ may include a first nozzle unit NZ1 formed in the first area A1, a second nozzle unit NZ2 formed in the second area A2, a third nozzle unit NZ3 formed in the third area A3, a fourth nozzle unit NZ4 formed in the fourth area A4, and a fifth nozzle unit NZ5 formed in the fifth area A5 of the nozzle surface 714.

The first nozzle unit NZ1 may include one or more first nozzles NZ1 having a first diameter D1. The second nozzle unit NZ2 may include one or more second nozzles NZ2 having a second diameter D2. The third nozzle unit NZ3 may include one or more third nozzles NZ3 having a third diameter D3. The fourth nozzle unit NZ4 may include one or more fourth nozzles NZ4 having a fourth diameter D4. The fifth nozzle unit NZ5 may include one or more fifth nozzles NZ5 having a fifth diameter D5. The first to fifth diameters D1, D2, D3, D4, and D5 may be different from each other. In this specification, the nozzle unit may include one or more nozzles having the same diameter, so that the nozzle unit may refer to one or more nozzles having the same diameter and the nozzle may refer to one nozzle.

In the print head unit 700 according to an embodiment, in the case of heating the inkjet head 710 to the reference temperature tr using the heater 720, the nozzle surface 714 of the inkjet head 710 may include the areas having different temperatures, and the nozzles formed respectively in the areas having different temperatures may have different diameters. For example, as shown in FIG. 5, the first diameters D1 of the first nozzles NZ1 formed in the first area A1 where the temperature of the nozzle surface 714 is the first temperature t1 may be the same, but the second diameter D2 of the second nozzle NZ2 formed in the second area A2 where the temperature of the nozzle surface 714 is the second temperature t2 different from the first temperature t1 may be different from the first diameter D1 of the first nozzle NZ1. Similarly, the first to fifth diameters D1, D2, D3, D4, and D5 of the first to fifth nozzles NZ1, NZ2, NZ3, NZ4, and NZ5 may be different from each other.

On the other hand, the first to third areas A1, A2, and A3 where the temperatures of the nozzle surface 714 are different from each other may be located or disposed on the same extension line extending along the second direction DR2. Therefore, the first nozzle NZ1 formed in the first area A1, the second nozzle NZ2 formed in the second area A2, and the third nozzle NZ3 formed in the third area A3 may located or disposed on the same extension line extending along the second direction DR2. For example, the nozzles NZ arranged or disposed in the same row may include the nozzles NZ having different diameters depending on the temperature of the nozzle surface 714 where the nozzles NZ are formed. For example, the nozzles NZ arranged or disposed in the first row may include the first nozzle NZ1 having the first diameter D1, the second nozzle NZ2 having the second diameter D2, and the third nozzle NZ3 having the third diameter D3.

Further, the first area A1, the fourth area A4, and the fifth area A5 where the temperatures of the nozzle surface 714 are different from each other may be located or disposed on the same extension line extending along the second direction DR2. Therefore, the first nozzle NZ1 formed in the first area A1, the fourth nozzle NZ4 formed in the fourth area A4, and the fifth nozzle NZ5 formed in the fifth area A5 may be located or disposed on the same extension line extending along the second direction DR2. For example, the nozzles NZ arranged or disposed in the same row may include the nozzles NZ having different diameters depending on the temperature of the nozzle surface 714 where the nozzles NZ are formed. For example, the nozzles NZ arranged or disposed in the second row may include the first nozzle NZ1 having the first diameter D1, the fourth nozzle NZ4 having the fourth diameter D4, and the fifth nozzle NZ5 having the fifth diameter D5.

Although not limited to the following, the diameter of the nozzle NZ formed in each area may be reduced as the temperature of each area of the nozzle surface 714 is increased. For example, the first temperature t1 of the first area A1 may be higher than the second temperature t2 of the second area A2, and the first diameter D1 of the first nozzle NZ1 may be smaller than the second diameter D2 of the second nozzle NZ2. Further, the third temperature t3 of the third area A3 may be lower than the first temperature t1 and the second temperature t2, and the third diameter D3 of the third nozzle NZ3 may be greater than the first diameter D1 of the first nozzle NZ1 and the second diameter D2 of the second nozzle NZ2.

Further, the temperature of the nozzle surface 714 may be increased from the edge toward the center of the nozzle surface 714. For example, the fourth temperature t4 of the fourth area A4 may be higher than the first temperature t1 of the first area A1. Therefore, the fourth diameter D4 of the fourth nozzle NZ4 may be smaller than the first diameter D1 of the first nozzle NZ1. On the other hand, the distribution of the nozzles NZ shown in the drawing is by way of example, and the disclosure is not limited thereto. For example, the temperature distribution of the nozzle surface 714 of the inkjet head 710 may vary depending on the arrangement of the heater 720 and the material of the inkjet head 710, and the nozzles NZ formed on the nozzle surface 714 may have different diameters depending on the temperature distribution of the nozzle surface 714 of the inkjet head 710.

Figure 6:
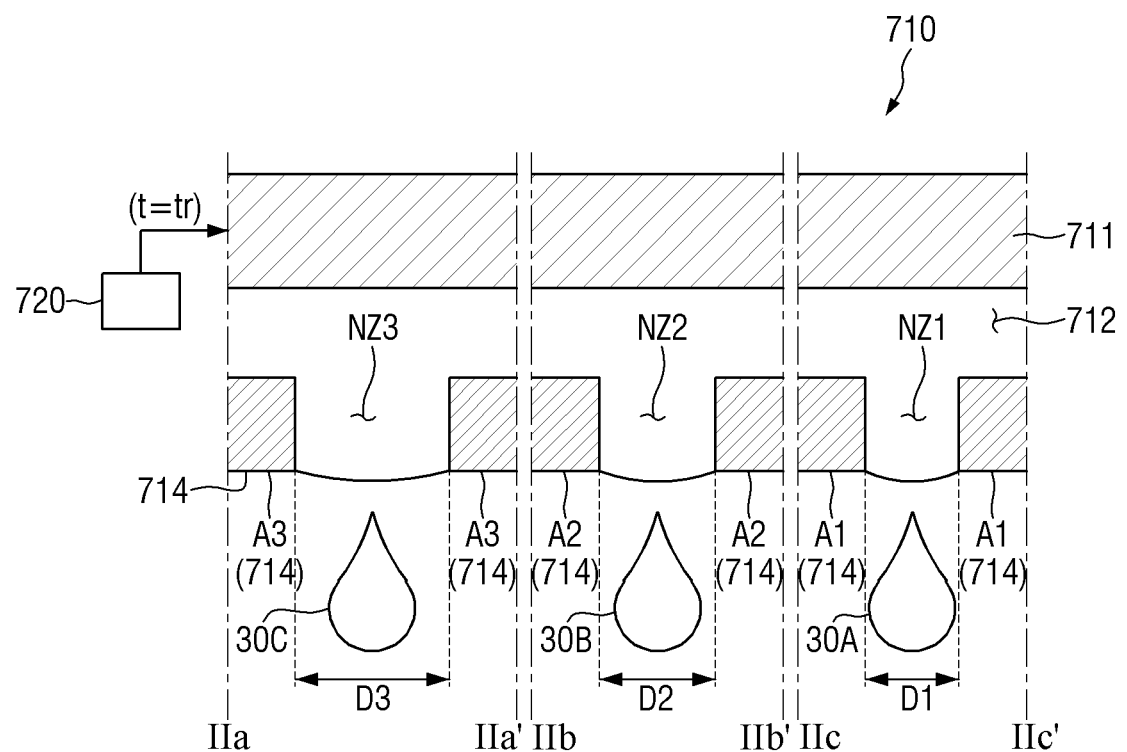
FIG. 6 is a schematic cross-sectional view taken along line IIa-IIa', line IIb-IIb', and line IIc-IIc' of FIG. 4, and is a partial schematic cross-sectional view showing a spraying process using an inkjet printing apparatus.

FIG. 6 is a schematic cross-sectional view taken along line IIa-IIa', line IIb-IIb', and line IIc-IIc' of FIG. 4, and is a partial schematic cross-sectional view showing a spraying process using an inkjet printing apparatus.

In order to spray the ink 30 using the inkjet head 710, the ink 30 sprayed through the nozzle NZ of the inkjet head 710 needs to have ejection characteristics suitable for the printing process. By way of example, in case that the ejection characteristics of the ink 30 sprayed through the nozzles NZ of the inkjet head 710 are the same, the uniformity of the printing process using the inkjet head 710 may be improved and, thus, the reliability of the printing process may be improved. On the other hand, the physical properties of the ink 30 that affect the ejection characteristics of the ink 30 sprayed through the nozzles NZ of the inkjet head 710 include viscosity, density, and surface tension of the ink 30. On the other hand, the ejection characteristics of the ink 30 sprayed through the nozzle NZ may use the Ohnesorge number (Oh) that is a combination of the viscosity, the density, and the surface tension of the ink 30 and the diameter of the nozzle NZ through which the ink 30 is sprayed, or a reciprocal (Z, Z=1/Oh, hereinafter, referred to as "ejection constant") of the Ohnesorge number. The Ohnesorge number (Oh) or the ejection constant Z may be expressed by the following Eq. (1). The same ejection constant Z may mean the same ejection characteristics of the ink 30 sprayed through the nozzle NZ.

$$Z = \frac{1}{Oh} = \frac{(acD)^{1/2}}{b} \quad (1)$$

In the above Eq. (1), Z may refer to the ejection constant, Oh may refer to the Ohnesorge number, a may refer to the density of the ink, b may refer to the viscosity of the ink, c may refer to the surface tension of the ink, and D may refer to the diameter of the nozzle through which the ink is sprayed.

On the other hand, the ink 30 sprayed using the print head unit 700 of the inkjet printing apparatus 1000 may have different physical properties such as the density, the viscosity, and the surface tension of the ink depending on the temperature of the ink 30. As described above, although the inkjet head 710 is heated using the heater 720 such that the temperature of the nozzle surface 714 of the inkjet head 710 becomes the reference temperature tr, the temperature of the nozzle surface 714 of the inkjet head 710 may be different depending on the positions or the areas. Therefore, the temperature of the ink 30 sprayed through the nozzles NZ formed on the nozzle surface 714 having different temperatures may be different depending on the positions or the areas of the nozzle surface 714 where the nozzles NZ are formed. For example, the temperature of the ink 30 sprayed through the nozzle NZ may be substantially the same as the temperature of the nozzle surface 714 where the nozzle NZ is formed. Therefore, the physical properties of the ink 30 sprayed from each nozzle NZ, such as the density, the viscosity, and the surface tension of the ink 30, may be different depending on the areas where the nozzles NZ are formed. Therefore, the diameters of the nozzles NZ formed in the areas having different temperatures may be different from each other.

By way of example, in the case of heating the inkjet head 710 to the reference temperature tr using the heater 720, a first ejection constant Z1 of a first ink 30A ejected through the first nozzle NZ1 formed in the first area A1 may be expressed by the following Eq. (2).

$$Z1 = \frac{1}{Oh1} = \frac{(a1c1D1)^{1/2}}{b1} \quad (2)$$

In the above Eq. (2), Z1 may refer to a first ejection constant, Oh1 may refer to a first Ohnesorge number, a1 may refer to a first density of the first ink 30A, b1 may refer to a first viscosity of the first ink 30A, c1 may refer to a first surface tension of the first ink 30A, and D1 may refer to the first diameter D1 of the first nozzle NZ1. The first ink 30A may be the ink 30 having the first temperature t1, the first density a1 may be the density of the ink 30 at the first temperature t1, the first viscosity b1 may be the viscosity of the ink 30 at the first temperature t1, and the first surface tension c1 may be the surface tension of the ink 30 at the first temperature t1.

Similarly, in the case of heating the inkjet head 710 to the reference temperature tr using the heater 720, a second ejection constant Z2 of a second ink 30B ejected through the second nozzle NZ2 formed in the second area A2 may be expressed by the following Eq. (3).

$$Z2 = \frac{1}{Oh2} = \frac{(a2c2D2)^{1/2}}{b2} \quad (3)$$

In the above Eq. (3), Z2 may refer to a second ejection constant, Oh2 may refer to a second Ohnesorge number, a2 may refer to a second density of the second ink 30B, b2 may refer to a second viscosity of the second ink 30B, c2 may refer to a second surface tension of the second ink 30B, and D2 may refer to the second diameter D2 of the second nozzle NZ2. The second ink 30B may be the ink 30 having the second temperature t2, the second density a2 may be the density of the ink 30 at the second temperature t2, the second viscosity b2 may be the viscosity of the ink 30 at the second temperature t2, and the second surface tension c2 may be the surface tension of the ink 30 at the second temperature t2.

On the other hand, as described above, in case that the values of the ejection constants Z are the same, the ejection characteristics of the ink 30 ejected through the nozzle NZ may be the same. Therefore, in case that the first ejection constant Z1 of the first ink 30A sprayed through the first nozzle NZ1 and the second ejection constant Z2 of the second ink 30B sprayed through the second nozzle NZ2 are the same as in the following Eq. (4), the ejection characteristics of the first ink 30A and the second ink 30B may be the same.

$$Z1 = \frac{(a1c1D1)^{1/2}}{b1} = \frac{(a2c2D2)^{1/2}}{b2} = Z2 \quad (4)$$

Therefore, the first diameter D1 of the first nozzle NZ1 and the second diameter D2 of the second nozzle NZ2 may have a relationship expressed by the following Eq. (5), and the first diameter D1 of the first nozzle NZ1 and the second diameter D2 of the second nozzle NZ2 may be expressed by the following Eq. (6).

$$\frac{D2}{D1} = \frac{a2c2b2^2}{a2c2b1^2} \quad (5)$$

$$D1 = \frac{b1^2 Z^2}{a1c1} = \frac{b1^2}{a1c1Oh^2}, D2 = \frac{b2^2 Z^2}{a2c2} = \frac{b2^2}{a2c2Oh^2} \quad (6)$$

In the above Eq. (6), Z may refer to a fixed ejection constant in the inkjet head 710 according to an embodiment.

Similarly, in the case of heating the inkjet head 710 to the reference temperature tr using the heater 720, a third ejection constant Z3 of a third ink 30C ejected through the third nozzle NZ3 formed in the third area A3 may be expressed by the following Eq. (7).

$$Z3 = \frac{1}{Oh3} = \frac{(a3c3D3)^{1/2}}{b3} \quad (7)$$

In the above Eq. (7), Z3 may refer to a third ejection constant, Oh3 may refer to a third Ohnesorge number, a3 may refer to a third density of the third ink 30C, b3 may refer to a third viscosity of the third ink 30C, c3 may refer to a third surface tension of the third ink 30C, and D3 may refer to the third diameter D3 of the third nozzle NZ3. The third ink 30C may be the ink 30 having the third temperature t3, the third density a3 may be the density of the ink 30 at the third temperature t3, the third viscosity b3 may be the viscosity of the ink 30 at the third temperature t3, and the third surface tension c3 may be the surface tension of the ink 30 at the third temperature t3. Further, the third diameter D3 of the third nozzle NZ3 may be expressed by the following Eq. (8).

$$D3 = \frac{b3^2 Z^2}{a3c3} \quad (8)$$

Similarly, in the above Eq. (8), Z may refer to a fixed ejection constant in the inkjet head 710 according to an embodiment.

Since the first diameter D1 of the first nozzle NZ1 and the second diameter D2 of the second nozzle NZ2 satisfy the above Eq. (6) and the third diameter D3 of the third nozzle NZ3 satisfies the above Eq. (8), the ejection characteristics of the first to third inks 30A, 30B, and 30C respectively sprayed through the first to third nozzles NZ1, NZ2, and NZ3 may be the same.

For example, the inkjet printing apparatus 1000 according to an embodiment may include the print head unit 700 including the inkjet head 710 having the nozzle surface 714 where the nozzles NZ are formed and spray the ink 30 from each of the nozzles NZ, and the heater 720 for heating the inkjet head 710 to the reference temperature tr. The nozzle surface 714 may include areas An (n being a natural number) having different temperatures in the case of heating the inkjet head 710 to the reference temperature tr using the heater 720. A diameter Dn (n being a natural number) of a nozzle NZn (n being a natural number) formed in each of the areas An may be expressed by the following Eq. (9).

$$Dn = \frac{bn^2 Z^2}{ancn} = \frac{bn^2}{ancnOh^2} \quad (9)$$

In the above Eq. (9), Dn may refer to a diameter of an $n^{th}$ nozzle formed in an $n^{th}$ area where the temperature of the nozzle surface 714 of the inkjet head 710 is an $n^{th}$ temperature tn (n being a natural number), an may refer to a density of the ink 30 at the $n^{th}$ temperature tn, bn may refer to a viscosity of the ink 30 at the $n^{th}$ temperature tn, cn may refer to a surface tension of the ink 30 at the $n^{th}$ temperature tn, Z may refer to the ejection characteristic constant, Oh may refer to the Ohnesorge number.

In an embodiment, since the diameters D of the nozzles NZ of the inkjet head 710 are designed to satisfy the above Eq. (9) depending on the temperature of the nozzle surface 714 where the nozzles NZ are formed, the ejection characteristics of the ink 30 sprayed through each of the nozzles NZ may be the same even though the temperature of the nozzle surface 714 of the inkjet head 710 is different depending on the areas. Therefore, by designing the diameters of the nozzles NZ to be different depending on the temperature of the nozzle surface 714, the ejection characteristics of the ink 30 sprayed through the nozzle NZ become the same, which makes it possible to improve the reliability of the printing process using the inkjet printing apparatus 1000.

Hereinafter, a method of manufacturing an inkjet head according to an embodiment will be described in conjunction with FIGS. 1 to 6.

Figure 7:
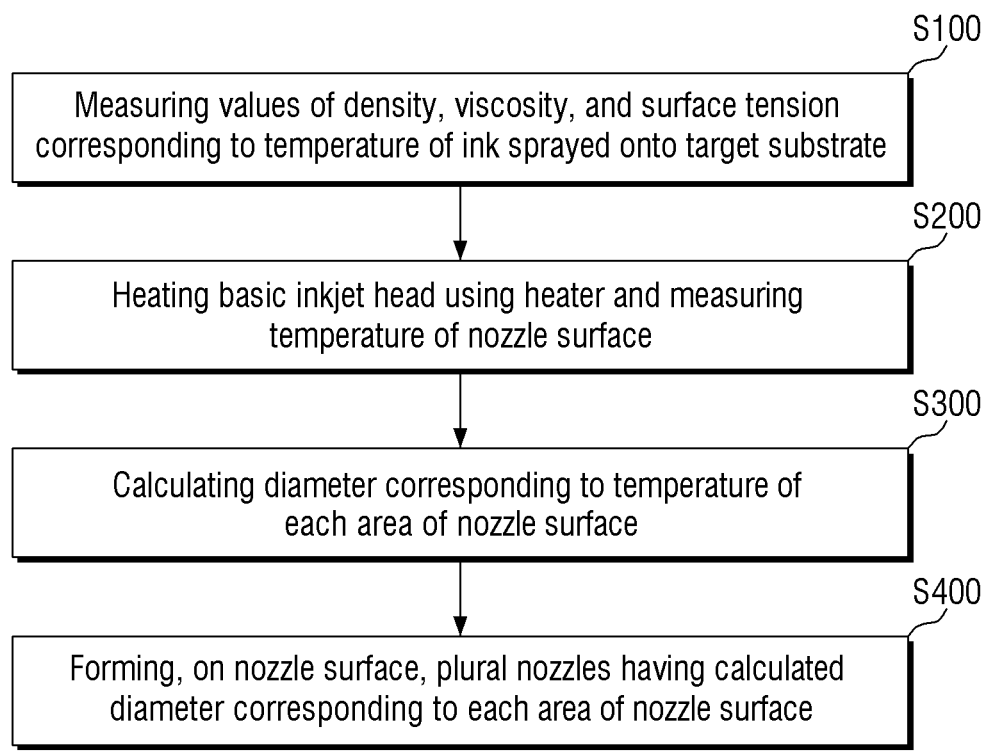
FIG. 7 is a flowchart showing a method of manufacturing an inkjet head according to an embodiment.
Figure 8:
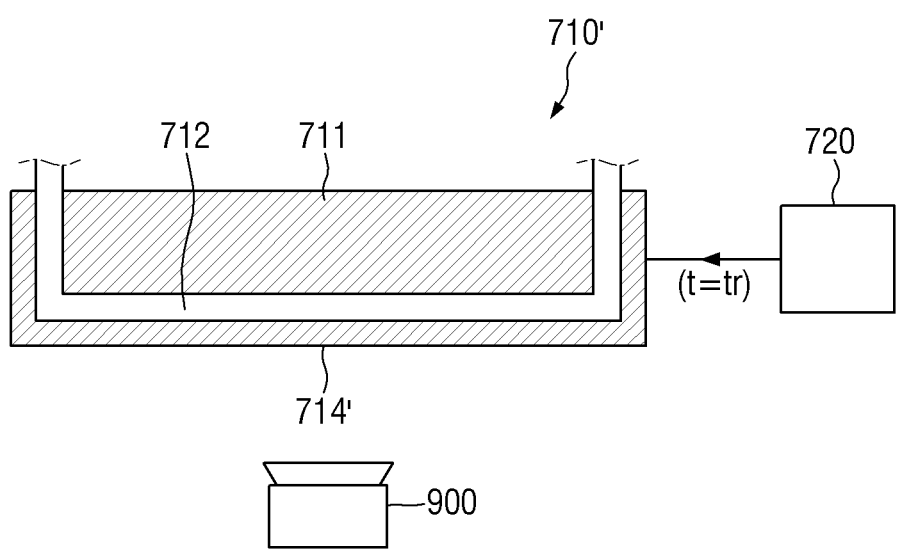
FIG. 8 is a side view showing an example of step S200 of FIG. 7.
Figure 9:
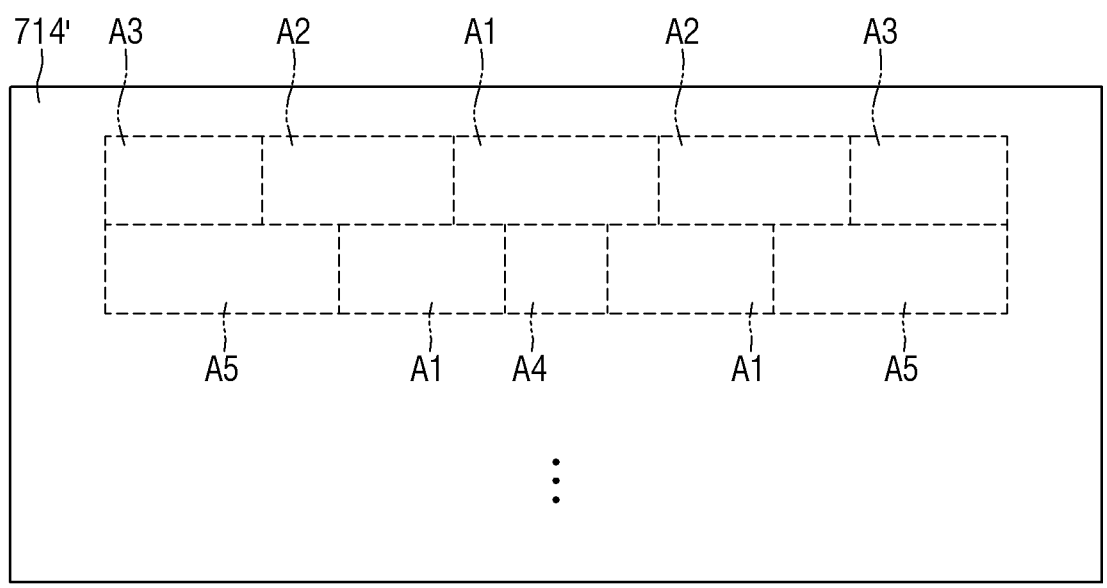
FIG. 9 is a schematic view showing an example of step S300 of FIG. 7.

FIG. 7 is a flowchart showing a method of manufacturing an inkjet head according to an embodiment. FIG. 8 is a side view showing an example of step S200 of FIG. 7. FIG. 9 is a schematic view showing an example of step S300 of FIG. 7.

Referring to FIG. 7, the method of manufacturing an inkjet head according to an embodiment may include measuring values of a density, a viscosity, and a surface tension corresponding to the temperature of the ink sprayed onto the target substrate (step S100), heating a basic inkjet head using the heater and measuring the temperature of the nozzle surface (step S200), calculating the diameter of the nozzle corresponding to the temperature of each area of the nozzle surface (step S300), and forming, on the nozzle surface, nozzles having the calculated nozzle diameter corresponding to each area of the nozzle surface (step S400).

First, the values of the density, the viscosity, and the surface tension corresponding to the temperature of the ink 30 sprayed onto the target substrate SUB are measured (step S100 of FIG. 7).

By way of example, the ink 30 whose characteristics corresponding to the temperature are measured may be the ink sprayed onto the target substrate SUB using the inkjet printing apparatus 1000 according to an embodiment. The values of the density a), the viscosity (b), and the surface tension (c) of the ink 30 may be different depending on temperatures. Therefore, in this step, the values of the density (a), the viscosity (b), and the surface tension (c) corresponding to the temperature of the ink 30 sprayed onto the target substrate SUB may be measured.

For example, the ink 30 sprayed onto the target substrate SUB may have the first density a1, the first viscosity b1, and the first surface tension c1 at the first temperature t1, may have the second density a2, the second viscosity b2, and the second surface tension c2 at the second temperature t2, may have the third density a3, the third viscosity b3, and the third surface tension c3 at the third temperature t3, may have the fourth density a4, the fourth viscosity b4, and the fourth surface tension c4 at the fourth temperature t4, and may have the fifth density a5, the fifth viscosity b5, and the fifth surface tension c5 at the fifth temperature t5. The first to fifth temperatures t1, t2, t3, t4, and t5 may be different from each other.

A basic inkjet head 710' is heated using the heater 720, and the temperature of a nozzle surface 714' of the basic inkjet head 710' is measured (step S200 of FIG. 7).

The step of heating the basic inkjet head 710' using the heater 720 and measuring the temperature of the nozzle surface 714' of the basic inkjet head 710' may include a step of preparing the basic inkjet head 710', a step of heating the basic inkjet head 710' using the heater 720, and a step of measuring the temperature of the nozzle surface 714' of the heated basic inkjet head 710' using a temperature measuring device 900.

By way of example, referring to FIG. 8, the basic inkjet head 710' may have a structure similar to that of the inkjet head 710, but may not have the nozzles NZ on the nozzle surface 714'. For example, the basic inkjet head 710', which is a member for designing the diameters of the nozzles NZ according to an embodiment before the nozzles NZ are formed, may be a dummy inkjet head.

The base portion 711 of the basic inkjet head 710' may be heated using the heater 720 such that the temperature t of the nozzle surface 714' of the basic inkjet head 710' becomes the reference temperature tr. The reference temperature tr may be defined as an optimal temperature at which the ink 30 is sprayed onto the target substrate SUB.

The temperature of the nozzle surface 714' of the heated basic inkjet head 710' may be measured using the temperature measuring device 900. The temperature measuring device 900 may be disposed to face the nozzle surface 714' of the basic inkjet head 710'. The temperature measuring device 900 is not limited as long as it is possible to measure the temperature of the nozzle surface 714' of the basic inkjet head 710'. For example, the temperature measuring device 900 may include a temperature sensor, a thermal imaging camera, or the like capable of detecting and/or measuring the temperature of the nozzle surface 714' of the basic inkjet head 710'.

In case that the temperature measuring device 900 may include the thermal imaging camera, the thermal imaging camera may capture the image of the nozzle surface 714' of the basic inkjet head 710' to measure the surface temperature of the basic inkjet head 710', for example, the temperature of the nozzle surface 714'. Hereinafter, the case where the temperature measuring device 900 may include the thermal image camera will be described as an example. However, the embodiment is not limited to the embodiment in which the temperature measuring device 900 may include the thermal image camera, and the temperature measuring apparatus 900 including a temperature measuring device and/or a temperature detection device mentioned above may be applied within the disclosure.

The temperature measuring device 900 may measure the temperature of the nozzle surface 714' of the basic inkjet head 710' and generate measurement data or image data including temperature information of the nozzle surface 714'. For example, the temperature measuring device 900 may capture the image of the nozzle surface 714' of the basic inkjet head 710' and generate a thermal image displaying the temperatures of the positions or the areas of the nozzle surface 714' of the basic inkjet head 710'.

For example, the temperature data of the nozzle surface 714' of the basic inkjet head 710' that is generated using the temperature measuring device 900 may include areas. The nozzle surface 714' of the basic inkjet head 710' may include the areas having different temperatures. For example, as shown in FIG. 9, the nozzle surface 714' of the basic inkjet head 710' may include the first area A1 where the temperature of the nozzle surface 714' is the first temperature t1, the second area A2 where the temperature of the nozzle surface 714' is the second temperature t2, the third area A3 where the temperature of the nozzle surface 714' is the third temperature t3, the fourth area A4 where the temperature of the nozzle surface 714' is the fourth temperature t4, and the fifth area A5 where the temperature of the nozzle surface 714' is the fifth temperature t5. The first to fifth temperatures t1, t2, t3, t4, and t5 may be different from each other.

The diameter of the nozzle NZ corresponding to the temperature of each area of the nozzle surface 714' of the basic inkjet head 710' is calculated (step S300 of FIG. 7).

The ejection characteristics of the ink 30 sprayed (ejected) through the nozzle NZ may be determined by the ejection constant Z of the following Eq. (10).

$$Z = \frac{1}{Oh} = \frac{(acD)^{1/2}}{b} \qquad (10)$$

In the above Eq. (10), Z may refer to the ejection constant, Oh may refer to the Ohnesorge number, a may refer to the density of the ink, b may refer to the viscosity of the ink, c may refer to the surface tension of the ink, and D may refer to the diameter of the nozzle through which the ink is sprayed.

Therefore, in case that the ejection constants Z are the same, the ejection characteristics of the ink 30 sprayed through the nozzles NZ are the same. In case that the ejection characteristics of the ink 30 dispersed through the nozzles NZ are the same, the uniformity of the printing process may be improved. On the other hand, the density (a), the viscosity (b), and the surface tension (c) of the ink 30 may be different depending on the temperature of the ink 30, as described above. Therefore, the ejection characteristics of the ink 30 sprayed through the nozzles NZ may become the same by calculating the diameters D of the nozzles NZ corresponding to the temperature of the ink 30 sprayed through the nozzles NZ such that the ejection constants Z of the ink 30 sprayed through the nozzles NZ become the same.

The following Eq. (11) is obtained by organizing the above Eq. (10) with respect to the diameter D of the nozzle NZ.

$$D = \frac{b^2 Z^2}{ac} = \frac{b^2}{acOh^2} \qquad (11)$$

In the above Eq. (11), Z may refer to the ejection constant, Oh may refer to the Ohnesorge number, a may refer to the density of the ink, b may refer to the viscosity of the ink, c may refer to the surface tension of the ink, and D may refer to the diameter of the nozzle through which the ink is sprayed.

As described above, the nozzle surface 714' of the basic inkjet head 710' may include the areas having different temperatures, and the $n^{th}$ diameter Dn (n being a natural number) of the $n^{th}$ nozzle NZn (n being a natural number) formed in the $n^{th}$ area among the areas may be calculated such that the $n^{th}$ diameter Dn satisfies the following Eq. (12).

$$Dn = \frac{bn^2 Z^2}{ancn} = \frac{bn^2}{ancnOh^2} \qquad (12)$$

In the above Eq. (12), Dn may refer to the diameter of the $n^{th}$ nozzle formed in the $n^{th}$ area where the temperature of the nozzle surface 714' of the basic inkjet head 710' is the $n^{th}$ temperature, an may refer to the density of the ink 30 at the $n^{th}$ temperature, bn may refer to the viscosity of the ink 30 at the $n^{th}$ temperature, cn may refer to the surface tension of the ink 30 at the $n^{th}$ temperature, Z may refer to the ejection characteristic constant, and Oh may refer to the Ohnesorge number. As described above, the diameter of the nozzle NZ is calculated by substituting the previously measured values of the density, the viscosity, and the surface tension of the ink 30 corresponding to the temperature of the ink 30 in the Eq. (12).

For example, the diameter of D1 of the first nozzle NZ1 formed in the first area A1 where the temperature of the nozzle surface 714' of the basic inkjet head 710' is the first temperature t1 may satisfy the following Eq. (13).

$$D1 = \frac{b1^2 Z^2}{a1c1} = \frac{b1^2}{a1c1Oh^2} \qquad (13)$$

In the above Eq. (13), D1 may refer to the diameter of the first nozzle NZ1 formed in the first area where the temperature of the nozzle surface 714' of the basic inkjet head 710' is the first temperature t1, a1 may refer to the first density of the ink 30 at the first temperature t1, b1 may refer to the first viscosity of the ink 30 at the first temperature t1, c1 may refer to the first surface tension of the ink 30 at the first temperature t1, Z may refer to the ejection characteristic constant, and Oh may refer to the Ohnesorge number.

As described above, the first diameter D1 of the first nozzle NZ1 may be calculated by substituting the values of the first density a1, the first viscosity b1, and the first surface tension c1 of the ink 30 in the Eq. (12) based on the pre-measured data corresponding to the temperature of the ink 30.

Similarly, the second diameter D2 of the second nozzle NZ2 formed in the second area A2 where the temperature of the nozzle surface 714' of the basic inkjet head 710' is the second temperature t2 may satisfy the following Eq. (14).

$$D2 = \frac{b2^2 Z^2}{a2c2} = \frac{b2^2}{a2c2Oh^2} \qquad (14)$$

In the above Eq. (14), D2 may refer to the diameter of the second nozzle NZ2 formed in the second area A2 where the temperature of the nozzle surface 714' of the basic inkjet head 710' is the second temperature t2, a2 may refer to the second density of the ink 30 at the second temperature t2, b2 may refer to the second viscosity of the ink 30 at the second temperature t2, c2 may refer to the second surface tension of the ink 30 at the second temperature t2, Z may refer to the ejection characteristic constant, and Oh may refer to the Ohnesorge number.

As described above, the second diameter D2 of the second nozzle NZ2 may be calculated by substituting the values of the second density a2, the second viscosity b2, and the second surface tension c2 of the ink 30 in the Eq. (12) based on the pre-measured data corresponding to the temperature of the ink 30.

Hereinafter, the third to fifth diameters D3, D4, and D5 that are the respective diameters of the third to fifth nozzles NZ3, NZ4, and NZ5 may be calculated, similarly to the diameters of the first and second nozzles NZ1 and NZ2.

The nozzles NZ having the calculated diameters corresponding to the areas of the nozzle surface 714' are formed on the nozzle surface 714' (S400 of FIG. 7).

By way of example, the nozzles NZ having the calculated diameters are formed on the nozzle surface 714' of the basic inkjet head 710' where the nozzles NZ are not formed. By way of example, first nozzles NZ1 having the calculated first diameter D1 are formed in the first area A1, Second nozzles NZ2 having the calculated second diameter D2 are formed in the second area A2, and third nozzles NZ3 having the calculated third diameter D3 are formed in the third area A3, fourth nozzles NZ4 having the calculated fourth diameter D4 are formed in the fourth area A4, and fifth nozzles NZ5 having the calculated fifth diameter D5 are formed in the fifth area A5, thereby forming the inkjet head 710 as shown in FIG. 4. The first temperature may be greater than the second temperature, and the first diameter D1 may be smaller than the second diameter D2, although not limited thereto.

Figure 10:
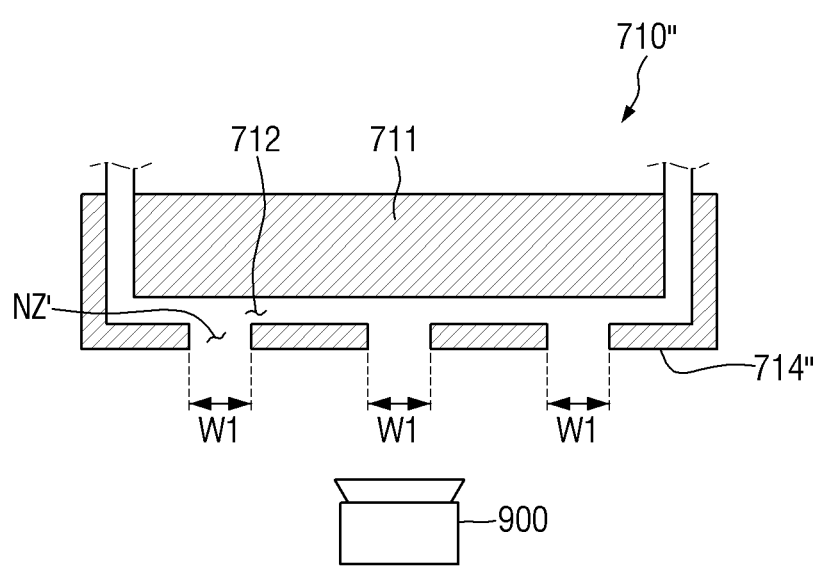
FIG. 10 is a side view showing another example of step S200 of FIG. 7.

FIG. 10 is a side view showing another example of step S200 of FIG. 7.

Referring to FIG. 10, an embodiment may be different from an embodiment of FIG. 8 in that basic nozzles NZ' having a basic nozzle diameter (or width) W1 may be formed on a nozzle surface 714" of a basic inkjet head 710" for which temperature is measured using the temperature measuring device 900.

By way of example, the basic nozzles NZ' having the basic nozzle diameter W1 may be formed on the nozzle surface 714" of the basic inkjet head 710" according to an embodiment. The temperature of the nozzle surface 714" of the basic inkjet head 710" where the basic nozzles NZ' are formed may be measured using the temperature measuring device 900. As described above, the diameter of the nozzle NZ formed in each area of the nozzle surface 714" may be calculated based on the measured temperature data of the nozzle surface 714" of the basic inkjet head 710".

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. An inkjet printing apparatus comprising:
a print head including:
an inkjet head having a nozzle surface;
nozzles disposed on the nozzle surface that spray an ink from the nozzles; and
a heater that heats a temperature of the inkjet head to a reference temperature, wherein
the nozzles include:
a first nozzle having a first diameter; and
a second nozzle having a second diameter different from the first diameter of the first nozzle,
the nozzle surface includes:
a first area in which the first nozzle is disposed; and
a second area in which the second nozzle is disposed,
the first area has a first temperature in case that the heater heats the inkjet head to the reference temperature, and
the second area has a second temperature different from the first temperature in case that the heater heats the inkjet head to the reference temperature.

2. The inkjet printing apparatus of claim 1, wherein the first nozzle and the second nozzle are disposed on a same extension line extending in a first direction.

3. The inkjet printing apparatus of claim 2, wherein the nozzles include a third nozzle having a third diameter different from the first diameter of the first nozzle and the second diameter of the second nozzle.

4. The inkjet printing apparatus of claim 3, wherein the nozzle surface includes a third area including the third nozzle, and the third area has a third temperature different from the first temperature of the first area and the second temperature of the second area in case that the heater heats the inkjet head to the reference temperature.

5. The inkjet printing apparatus of claim 4, wherein the first nozzle, the second nozzle, and the third nozzle are disposed on a same extension line extending in a first direction.

6. The inkjet printing apparatus of claim 4, wherein the first nozzle and the third nozzle are disposed on a same extension line extending in a second direction intersecting the first direction.

7. The inkjet printing apparatus of claim 1, wherein the first temperature of the first area is higher than the second temperature of the second area, and
the first diameter of the first nozzle is smaller than the second diameter of the second nozzle.

8. The inkjet printing apparatus of claim 1, wherein the first diameter of the first nozzle and the second diameter of the second nozzle satisfy:

$$D1 = \frac{b1^2}{a1c1Oh^2}, D2 = \frac{b2^2}{a2c2Oh^2}$$

where D1 is the first diameter of the first nozzle, D2 is the second diameter of the second nozzle, a1 is a density of the ink at the first temperature of the first area, a2 is a density of the ink at the second temperature of the second area, b1 is a viscosity of the ink at the first temperature of the first area, b2 is a viscosity of the ink at the second temperature of the second area, c1 is a surface tension of the ink at the first temperature of the first area, c2 is a surface tension of the ink at the second temperature of the second area, and Oh is an Ohnesorge number.

9. An inkjet printing apparatus comprising:
a print head including:
an inkjet head having a nozzle surface;
nozzles disposed on the nozzle surface, that spray an ink from the nozzles; and
a heater that heats a temperature of the inkjet head to a reference temperature, wherein
the nozzle surface includes areas having different temperatures in case that the heater heats the inkjet head to the reference temperature, and
a diameter of a nozzle in each of the areas satisfies:

$$Dn = \frac{bn^2}{ancnOh^2}$$

where Dn is a diameter of an $n^{th}$ nozzle disposed in an $n^{th}$ area where a temperature of the nozzle surface is an $n^{th}$ temperature, an is a density of the ink at the $n^{th}$ temperature, bn is a viscosity of the ink at the $n^{th}$ temperature, cn is a surface tension of the ink at the $n^{th}$ temperature, and Oh is an Ohnesorge number.

10. The inkjet printing apparatus of claim 9, wherein the nozzle surface includes a first area having a first temperature and a second area having a second temperature different from the first temperature of the first area in case that the heater heats the inkjet head to the reference temperature, and the nozzles include:
- a first nozzle unit including at least one first nozzle disposed in the first area; and
- a second nozzle unit including at least one second nozzle in the second area.

11. The inkjet printing apparatus of claim 10, wherein a first diameter of the at least one first nozzle is different from a second diameter of the at least one second nozzle.

12. The inkjet printing apparatus of claim 11, wherein the first nozzle unit includes first nozzles, and
the first nozzles are spaced apart from each other in a first direction in the first area of the nozzle surface.

13. The inkjet printing apparatus of claim 12, wherein the at least one first nozzle and the at least one second nozzle are disposed on a same extension line extending in the first direction.

14. The inkjet printing apparatus of claim 12, wherein the first nozzles have a same diameter.

15. The inkjet printing apparatus of claim 11, wherein
the first temperature of the first area of the nozzle surface is higher than the second temperature of the second area of the nozzle surface, and
the first diameter of the at least one first nozzle is smaller than the second diameter of the at least one second nozzle.

16. The inkjet printing apparatus of claim 15, wherein
the at least one first nozzle is disposed at a center of the nozzle surface, and
the at least one second nozzle is disposed at an edge of the nozzle surface.

17. The inkjet printing apparatus of claim 10, wherein
the nozzle surface includes a third area having a third temperature in case that the heater heats the inkjet head to the reference temperature,
the nozzles include a third nozzle unit including at least one third nozzle in the third area, and
the third temperature of the third area of the nozzle surface is different from the first temperature of the first area of the nozzle surface and the second temperature of the second area of the nozzle surface.

18. The inkjet printing apparatus of claim 17, wherein the at least one first nozzle, the at least one second nozzle, and the at least one third nozzle are disposed on a same extension line extending in a first direction.

19. The inkjet printing apparatus of claim 17, wherein
the at least one first nozzle and the at least one second nozzle are disposed on a same extension line extending in a first direction, and
the at least one first nozzle and the at least one third nozzle are disposed on a same extension line extending in a second direction intersecting the first direction.

20. The inkjet printing apparatus of claim 17, wherein a first diameter of the at least one first nozzle, a second diameter of the at least one second nozzle, and a third diameter of the at least one third nozzle are different from each other.

* * * * *